(12) United States Patent
Sasaki et al.

(10) Patent No.: US 10,985,302 B2
(45) Date of Patent: *Apr. 20, 2021

(54) PICK-AND-REMOVE SYSTEM WITH DEFORMABLE CONTACT SURFACE

(71) Applicant: eLux Inc., Vancouver, WA (US)

(72) Inventors: Kenji Sasaki, West Linn, OR (US);
Paul J. Schuele, Washougal, WA (US);
Kurt Ulmer, Vancouver, WA (US);
Jong-Jan Lee, Camas, WA (US)

(73) Assignee: eLUX, Inc., Vancouver, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/549,205

(22) Filed: Aug. 23, 2019

(65) Prior Publication Data

US 2020/0006613 A1 Jan. 2, 2020

Related U.S. Application Data

(60) Division of application No. 15/416,882, filed on Jan. 26, 2017, now Pat. No. 10,446,728, which is a
(Continued)

(51) Int. Cl.
*H01L 33/62* (2010.01)
*H01L 25/075* (2006.01)
(Continued)

(52) U.S. Cl.
CPC .............. *H01L 33/62* (2013.01); *H01L 22/22* (2013.01); *H01L 24/799* (2013.01);
(Continued)

(58) Field of Classification Search
CPC ............. H01L 2225/03; H01L 2225/04; H01L 2225/065; H01L 27/08; H01L 27/0814;
(Continued)

(56) References Cited

U.S. PATENT DOCUMENTS

4,597,815 A * 7/1986 Nakamura ............ B44C 1/1716
156/234
4,652,757 A * 3/1987 Carver ............... G01N 21/1717
250/338.1
(Continued)

*Primary Examiner* — Maliheh Malek
(74) *Attorney, Agent, or Firm* — Law Office of Gerald Maliszewski; Gerald Maliszewski (57) ABSTRACT

A system and method are provided for repairing an emissive display. Following assembly, the emissive substrate is inspected to determine defective array sites, and defect items are removed using a pick-and-remove process. In one aspect, the emissive substrate includes an array of wells, with emissive elements located in the wells, but not electrically connected to the emissive substrate. If the emissive elements are light emitting diodes (LEDs), then the emissive substrate is exposed to ultraviolet illumination to photoexcite the array of LED, so that LED illumination can be measured to determine defective array sites. The defect items may be determined to be misaligned, mis-located, or non-functional emissive elements, or debris. Subsequent to determining these defect items, the robotic pick-and-remove process is used to remove them. The pick-and-remove process can also be repurposed to populate empty wells with replacement emissive elements.

16 Claims, 7 Drawing Sheets

Related U.S. Application Data continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, and a continuation-in-part of application No. 14/530,230, filed on Oct. 31, 2014, now abandoned.

(51) Int. Cl.
  *H01L 21/66* (2006.01)
  *H01L 25/00* (2006.01)
  *H01L 23/00* (2006.01)
  *H01L 21/67* (2006.01)

(52) U.S. Cl.
  CPC .......... *H01L 25/0753* (2013.01); *H01L 25/50* (2013.01); *H01L 2224/95101* (2013.01); *H01L 2933/0033* (2013.01); *H01L 2933/0066* (2013.01)

(58) Field of Classification Search
  CPC ............... H01L 27/10; H01L 21/67121; H01L 21/67333; H01L 33/005; H01L 33/0095; H01L 33/20; H01L 33/48; H01L 33/483–486; H01L 33/62; H01L 2933/0033; H01L 2933/0066; H01L 25/04–042; H01L 25/048; H01L 25/065–0655; H01L 25/072; H01L 25/075–0753; H01L 25/105; H01L 25/13; H01L 25/16–167; H01L 25/18; H01L 2224/95085; H01L 2224/93–95085; H01L 24/90–93; H01L 24/95–96
  See application file for complete search history.

(56) References Cited

U.S. PATENT DOCUMENTS

| | | | | | |
|---|---|---|---|---|---|
| 4,752,180 | A * | 6/1988 | Yoshikawa | ........... | H01L 21/187 257/E21.088 |
| 5,092,954 | A * | 3/1992 | Braun | ........... | B29C 66/1122 156/540 |
| 5,129,827 | A * | 7/1992 | Hoshi | ........... | H01L 21/67092 438/457 |
| 5,250,843 | A * | 10/1993 | Eichelberger | ........ | H01L 23/538 257/687 |
| 5,355,577 | A * | 10/1994 | Cohn | ........... | B82Y 30/00 29/592.1 |
| 5,524,765 | A * | 6/1996 | Gutentag | ........... | H05K 13/0084 206/713 |
| 5,542,601 | A * | 8/1996 | Fallon | ........... | H01L 23/13 228/119 |
| 5,545,291 | A * | 8/1996 | Smith | ........... | G02F 1/1362 257/E21.505 |
| 5,800,759 | A * | 9/1998 | Yamazaki | ........ | B29C 45/14008 264/163 |
| 5,824,186 | A * | 10/1998 | Smith | ........... | H01L 21/78 438/597 |
| 5,954,898 | A * | 9/1999 | McKague | ........... | B29C 70/342 156/182 |
| 5,963,662 | A * | 10/1999 | Vachtsevanos | ........ | G01N 21/88 250/332 |
| 6,016,358 | A * | 1/2000 | Balamurugan | ........... | G06T 7/70 382/151 |
| 6,120,130 | A * | 9/2000 | Hirano | ........... | B41J 2/005 347/46 |
| 6,193,143 | B1 * | 2/2001 | Ishikawa | ........... | H01L 21/4846 228/245 |
| 6,246,787 | B1 * | 6/2001 | Hennessey | ........ | G01N 21/95607 250/559.45 |
| 6,292,582 | B1 * | 9/2001 | Lin | ........... | G01N 21/95607 257/E23.179 |
| 6,388,333 | B1 * | 5/2002 | Taniguchi | ........... | H01L 23/49816 257/777 |
| 6,533,159 | B1 * | 3/2003 | Cobbley | ........... | H05K 3/3478 228/20.1 |
| 6,585,471 | B2 * | 7/2003 | Odajima | ........... | H01L 21/67132 156/701 |
| 6,599,769 | B2 * | 7/2003 | Kondo | ........... | G02B 6/29361 257/E25.02 |
| 6,689,679 | B2 * | 2/2004 | Koyama | ........... | H01L 24/11 438/613 |
| 6,731,353 | B1 * | 5/2004 | Credelle | ........... | H01L 21/67144 257/723 |
| 6,756,796 | B2 * | 6/2004 | Subramanian | .... | H01L 21/67259 257/E23.179 |
| 6,850,312 | B2 * | 2/2005 | Jacobsen | ........... | G02F 1/133305 349/187 |
| 6,864,570 | B2 * | 3/2005 | Smith | ........... | G02F 1/1362 257/701 |
| 6,927,382 | B2 * | 8/2005 | King | ........... | H01L 24/95 250/214.1 |
| 7,080,444 | B1 * | 7/2006 | Craig | ........... | H01L 21/67144 257/E21.705 |
| 7,162,035 | B1 * | 1/2007 | Durst | ........... | G06K 19/086 380/54 |
| 7,223,635 | B1 * | 5/2007 | Brewer | ........... | B81C 3/002 257/E21.505 |
| 7,321,159 | B2 * | 1/2008 | Schatz | ........... | H01L 24/95 257/559 |
| 7,452,748 | B1 * | 11/2008 | Craig | ........... | G06K 19/07718 257/E21.511 |
| 7,662,008 | B2 * | 2/2010 | Hillis | ........... | H01L 24/95 445/24 |
| 7,727,788 | B2 * | 6/2010 | Han | ........... | H01L 24/95 257/E21.085 |
| 7,727,804 | B2 * | 6/2010 | Smith | ........... | G02F 1/1362 257/E21.598 |
| 7,943,052 | B2 * | 5/2011 | Wu | ........... | H01L 24/95 216/20 |
| 8,037,918 | B2 * | 10/2011 | Wang | ........... | H01L 21/6838 156/285 |
| 8,300,007 | B2 * | 10/2012 | Hillis | ........... | G09F 9/30 345/107 |
| 8,349,116 | B1 * | 1/2013 | Bibl | ........... | H01L 21/67144 156/249 |
| 8,384,630 | B2 * | 2/2013 | Ray | ........... | B82Y 20/00 345/82 |
| 8,390,537 | B2 * | 3/2013 | Hillis | ........... | H01L 24/95 345/55 |
| 8,570,482 | B2 * | 10/2013 | Hillis | ........... | H01L 25/046 349/187 |
| 8,696,818 | B2 * | 4/2014 | Robinson | ........... | B08B 1/00 134/6 |
| 8,780,097 | B2 * | 7/2014 | Xu | ........... | G09G 3/006 345/204 |

(56) References Cited

U.S. PATENT DOCUMENTS

| | | | |
|---|---|---|---|
| 8,791,474 B1* | 7/2014 | Bibl | G09G 3/3208 257/89 |
| 8,896,907 B2* | 11/2014 | Tweet | G02F 1/133553 359/296 |
| 9,266,689 B2* | 2/2016 | Hansel | H01L 21/486 |
| 9,299,674 B2* | 3/2016 | Yu | H01L 25/0657 |
| 9,373,530 B2* | 6/2016 | Schmidt-Lange | H01L 21/00 |
| 9,378,993 B2* | 6/2016 | Hosaka | B32B 43/006 |
| 9,531,002 B2* | 12/2016 | Lu | H01M 4/136 |
| 9,534,772 B2* | 1/2017 | Lowenthal | H01L 25/0753 |
| 9,554,484 B2* | 1/2017 | Rogers | A61B 5/01 |
| 9,586,325 B2* | 3/2017 | Truyens | B25J 15/0052 |
| 9,627,437 B1* | 4/2017 | Ulmer | H01L 27/156 |
| 9,647,029 B2* | 5/2017 | Lo | H01L 33/38 |
| 9,755,110 B1* | 9/2017 | Crowder | H01L 33/62 |
| 9,825,202 B2* | 11/2017 | Schuele | H01L 33/0079 |
| 9,837,390 B1* | 12/2017 | Sorensen | H01L 24/98 |
| 9,865,767 B2* | 1/2018 | Ray | B82Y 20/00 |
| 9,892,944 B2* | 2/2018 | Schuele | H01L 24/95 |
| 9,917,226 B1* | 3/2018 | Heine | H01L 33/005 |
| 10,170,664 B2* | 1/2019 | Schuele | H01L 33/0079 |
| 10,236,279 B2* | 3/2019 | Ulmer | H01L 25/0753 |
| 10,242,977 B2* | 3/2019 | Sasaki | H01L 27/153 |
| 10,319,878 B2* | 6/2019 | Ulmer | H01L 33/502 |
| 2001/0031514 A1* | 10/2001 | Smith | G02F 1/1362 438/107 |
| 2002/0041149 A1* | 4/2002 | Shimoda | H05B 33/10 313/504 |
| 2002/0053065 A1* | 5/2002 | Mitsutake | H01L 22/20 700/110 |
| 2002/0074630 A1* | 6/2002 | Ando | H01L 25/105 257/666 |
| 2003/0115747 A1* | 6/2003 | Schnetzler | H01L 21/6838 29/830 |
| 2003/0160343 A1* | 8/2003 | Hodgkinson | B29D 11/00192 264/1.1 |
| 2003/0186469 A1* | 10/2003 | Fonstad, Jr. | H01L 25/18 438/3 |
| 2003/0211652 A1* | 11/2003 | Summers | H01L 21/6838 438/106 |
| 2004/0045931 A1* | 3/2004 | Hill | B41M 7/0081 216/54 |
| 2004/0106334 A1* | 6/2004 | Suzuki | H01L 21/4853 439/894 |
| 2004/0179145 A1* | 9/2004 | Jacobsen | G02F 1/133305 349/45 |
| 2004/0222357 A1* | 11/2004 | King | H01L 24/95 250/214.1 |
| 2004/0238112 A1* | 12/2004 | Cheung | H01L 24/743 156/285 |
| 2004/0263830 A1* | 12/2004 | Shiba | G01R 31/308 356/237.1 |
| 2005/0000634 A1* | 1/2005 | Craig | H01L 24/81 156/230 |
| 2005/0030007 A1* | 2/2005 | Sakata | G01R 31/2887 324/754.16 |
| 2005/0047644 A1* | 3/2005 | Wong | G01N 21/8806 382/141 |
| 2005/0082684 A1* | 4/2005 | Aiba | H01L 25/065 257/778 |
| 2005/0087743 A1* | 4/2005 | Ogihara | H01L 25/0753 257/72 |
| 2005/0176170 A1* | 8/2005 | Detig | G03G 15/6591 438/106 |
| 2005/0196589 A1* | 9/2005 | Watanabe | H01L 24/95 428/172 |
| 2005/0221582 A1* | 10/2005 | Lee | B23K 37/047 438/455 |
| 2005/0255620 A1* | 11/2005 | Hadley | G02F 1/133305 438/28 |
| 2006/0057293 A1* | 3/2006 | Sharma | H01L 24/95 427/372.2 |
| 2006/0164647 A1* | 7/2006 | Shibata | G01N 21/89 356/430 |
| 2006/0176461 A1* | 8/2006 | Sekine | G03F 7/70341 355/67 |
| 2006/0220989 A1* | 10/2006 | Hillis | H01L 24/95 345/30 |
| 2006/0223225 A1* | 10/2006 | Arneson | H01L 21/67144 438/106 |
| 2006/0232769 A1* | 10/2006 | Sugihara | G01N 21/95692 356/237.2 |
| 2007/0040688 A1* | 2/2007 | Cocita | G06K 19/07749 340/572.7 |
| 2007/0080703 A1* | 4/2007 | Ding | G01N 21/95684 324/750.07 |
| 2007/0210505 A1* | 9/2007 | Chiu | B65H 3/0883 271/90 |
| 2007/0224713 A1* | 9/2007 | Han | H01L 24/95 438/26 |
| 2007/0272727 A1* | 11/2007 | Yang | H01L 21/6838 228/101 |
| 2008/0003719 A1* | 1/2008 | Lu | H01L 23/3675 438/113 |
| 2008/0023435 A1* | 1/2008 | Wu | H01L 24/95 216/2 |
| 2008/0181363 A1* | 7/2008 | Fenter | G01N 23/20 378/70 |
| 2008/0318346 A1* | 12/2008 | Maki | H01L 21/6835 438/7 |
| 2009/0021680 A1* | 1/2009 | Onishi | G02F 1/1309 349/124 |
| 2009/0047104 A1* | 2/2009 | Jung | H05K 13/021 414/222.07 |
| 2009/0059204 A1* | 3/2009 | Harris | G01J 3/463 356/51 |
| 2009/0064489 A1* | 3/2009 | Inoue | H05K 13/0812 29/739 |
| 2009/0136120 A1* | 5/2009 | Onushkin | G01N 21/956 382/149 |
| 2009/0218260 A1* | 9/2009 | Chow | H01L 24/95 209/577 |
| 2009/0298278 A1* | 12/2009 | Tu | H05K 3/3478 438/616 |
| 2010/0122654 A1* | 5/2010 | Sharma | H01L 25/50 118/69 |
| 2010/0141287 A1* | 6/2010 | Scocchetti | G01R 31/2874 324/750.3 |
| 2010/0144120 A1* | 6/2010 | Segawa | H01L 21/67092 438/464 |
| 2010/0166535 A1* | 7/2010 | Chen | H01L 21/67271 414/749.1 |
| 2010/0317132 A1* | 12/2010 | Rogers | H01L 33/486 438/27 |
| 2010/0323469 A1* | 12/2010 | Borthakur | H01L 21/76898 438/65 |
| 2011/0156741 A1* | 6/2011 | Scocchetti | G01R 31/2891 324/756.07 |
| 2011/0159412 A1* | 6/2011 | Chun | G03F 1/82 430/5 |
| 2011/0186873 A1* | 8/2011 | Emerson | H01L 33/48 257/88 |
| 2011/0205544 A1* | 8/2011 | Davis | G01R 29/0885 356/450 |
| 2011/0249111 A1* | 10/2011 | Weiss | H01L 22/20 348/87 |
| 2011/0277917 A1* | 11/2011 | Nakagawa | H01L 27/12 156/150 |
| 2012/0028342 A1* | 2/2012 | Ismagilov | C12Q 1/703 435/283.1 |
| 2012/0056340 A1* | 3/2012 | Kitagawa | G02B 5/3033 264/1.34 |
| 2012/0112220 A1* | 5/2012 | West | H01L 33/486 257/98 |
| 2012/0168089 A1* | 7/2012 | Schmidt-Lange | H01L 21/00 156/538 |
| 2012/0229805 A1* | 9/2012 | Watanabe | H01L 22/12 356/326 |

(56) References Cited

U.S. PATENT DOCUMENTS

| | | | |
|---|---|---|---|
| 2012/0285010 A1* | 11/2012 | Witvrouw | H01L 24/95 29/832 |
| 2013/0100089 A1* | 4/2013 | Xu | G09G 3/006 345/204 |
| 2013/0112351 A1* | 5/2013 | Hansel | F16B 11/006 156/309.9 |
| 2013/0122633 A1* | 5/2013 | Arase | H01L 31/0504 438/69 |
| 2013/0187540 A1* | 7/2013 | Tischler | H01L 27/14 313/512 |
| 2013/0210194 A1* | 8/2013 | Bibl | H01L 24/75 438/107 |
| 2013/0300812 A1* | 11/2013 | Bibl | H01L 25/0753 347/159 |
| 2014/0000804 A1* | 1/2014 | Looi | H01L 24/83 156/275.5 |
| 2014/0002128 A1* | 1/2014 | Ohmart | G01R 31/2831 324/762.03 |
| 2014/0080261 A1* | 3/2014 | Arase | H01L 24/83 438/118 |
| 2014/0119796 A1* | 5/2014 | Priebe | G03G 15/2096 399/340 |
| 2014/0159065 A1* | 6/2014 | Hu | H01L 33/0093 257/88 |
| 2014/0159066 A1* | 6/2014 | Hu | H01L 25/0753 257/88 |
| 2014/0175481 A1* | 6/2014 | Tischler | H01L 24/96 257/98 |
| 2014/0176922 A1* | 6/2014 | Robinson | G03F 1/82 355/30 |
| 2014/0210995 A1* | 7/2014 | Abe | H01L 33/005 348/93 |
| 2014/0234994 A1* | 8/2014 | Abe | G01N 21/6489 438/16 |
| 2014/0267683 A1* | 9/2014 | Bibl | G09G 3/006 348/87 |
| 2014/0302312 A1* | 10/2014 | Singh | C08J 7/06 428/338 |
| 2014/0306244 A1* | 10/2014 | Oraw | H01L 33/40 257/88 |
| 2015/0085169 A1* | 3/2015 | Igarashi | H01L 27/1469 348/294 |
| 2015/0155445 A1* | 6/2015 | Zhan | H01L 33/005 257/88 |
| 2015/0179877 A1* | 6/2015 | Hu | H01L 24/95 257/13 |
| 2015/0187991 A1* | 7/2015 | McGroddy | H01L 33/30 257/13 |
| 2015/0214430 A1* | 7/2015 | Zhan | H01L 33/20 257/13 |
| 2015/0263066 A1* | 9/2015 | Hu | H01L 27/153 257/9 |
| 2015/0325438 A1* | 11/2015 | Cho | H01L 21/02568 438/502 |
| 2016/0064282 A1* | 3/2016 | Carney | H01L 21/67144 257/737 |
| 2016/0144608 A1* | 5/2016 | Chang | B32B 37/12 216/83 |
| 2016/0155892 A1* | 6/2016 | Li | H01L 21/6831 257/89 |
| 2016/0158807 A1* | 6/2016 | Robinson | B82Y 30/00 15/104.001 |
| 2016/0254246 A1* | 9/2016 | Li | H01L 25/0655 438/107 |
| 2016/0263632 A1* | 9/2016 | Robinson | G03F 1/82 |
| 2016/0266165 A1* | 9/2016 | Robinson | B08B 1/00 |
| 2017/0062393 A1* | 3/2017 | Kim | H01L 24/92 |
| 2017/0133550 A1* | 5/2017 | Schuele | H01L 33/0079 |
| 2017/0133558 A1* | 5/2017 | Sasaki | H01L 33/62 |
| 2017/0139276 A1* | 5/2017 | Ulmer | G02F 1/133603 |
| 2017/0140961 A1* | 5/2017 | Sasaki | H01L 25/0753 |
| 2017/0179092 A1* | 6/2017 | Sasaki | H01L 25/50 |
| 2017/0186730 A1* | 6/2017 | Shen | H01L 21/568 |
| 2017/0215280 A1* | 7/2017 | Chaji | H01L 24/95 |
| 2017/0288102 A1* | 10/2017 | Farrens | H01L 33/0093 |
| 2017/0330855 A1* | 11/2017 | Tung | H01L 24/13 |
| 2017/0338389 A1* | 11/2017 | Zhan | H01L 33/62 |
| 2017/0365755 A1* | 12/2017 | Chu | C23C 16/50 |
| 2017/0372927 A1* | 12/2017 | Schuele | H01L 24/95 |
| 2018/0012873 A1* | 1/2018 | Lee | G09G 3/006 |
| 2018/0015497 A1* | 1/2018 | Nakamura | B05C 5/0225 |
| 2018/0029038 A1* | 2/2018 | Sasaki | B01L 3/502784 |
| 2018/0033915 A1* | 2/2018 | Crowder | H01L 27/156 |
| 2018/0047867 A1* | 2/2018 | Schuele | H01L 33/0079 |
| 2018/0076068 A1* | 3/2018 | Yuen | H01L 25/0753 |
| 2018/0076168 A1* | 3/2018 | Stecker | H01L 33/62 |
| 2018/0102352 A1* | 4/2018 | Sasaki | H01L 25/50 |
| 2018/0117796 A1* | 5/2018 | Demura | B29C 33/42 |
| 2018/0138359 A1* | 5/2018 | Ulmer | H01L 33/502 |
| 2018/0144957 A1* | 5/2018 | Schuele | H01L 24/95 |
| 2018/0158979 A1* | 6/2018 | Schuele | H01L 33/0079 |
| 2018/0190672 A1* | 7/2018 | Lee | H01L 25/0753 |
| 2018/0198020 A1* | 7/2018 | Lai | H01L 27/1259 |
| 2018/0198032 A1* | 7/2018 | He | H01L 33/48 |
| 2018/0204973 A1* | 7/2018 | Jeung | H01L 33/32 |
| 2018/0219139 A1* | 8/2018 | Sasaki | H01L 33/20 |
| 2018/0277524 A1* | 9/2018 | Moon | H01L 33/22 |
| 2019/0043843 A1* | 2/2019 | Liu | H01L 33/0095 |
| 2019/0096774 A1* | 3/2019 | Chaji | H01L 24/97 |
| 2019/0206714 A1* | 7/2019 | Hsiang | B81C 99/002 |
| 2019/0244846 A1* | 8/2019 | Hsieh | H01L 33/00 |
| 2020/0220042 A1* | 7/2020 | Ahn | H01L 33/648 |
| 2020/0235076 A1* | 7/2020 | Batres | H01L 33/62 |
| 2020/0321391 A1* | 10/2020 | Danesh | H01L 33/06 |
| 2020/0352070 A1* | 11/2020 | Conover | B25J 19/022 |
| 2020/0388736 A1* | 12/2020 | Chen | H01L 22/14 |
| 2020/0395521 A1* | 12/2020 | Brodoceanu | H01L 24/83 |
| 2021/0005520 A1* | 1/2021 | Ishio | H01L 21/67288 |

* cited by examiner

PICK-AND-REMOVE SYSTEM WITH DEFORMABLE CONTACT SURFACE

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to fluidically assembled emissive displays and, more particularly, to a system and method for the repair of emissive displays.

2. Description of the Related Art

The current competing technologies for large area display are liquid crystal display (LCD), organic light emitting device (OLED) display, and more recently, inorganic LED display. The weaknesses of LCD are: 1) low efficiency where only about 5% of the light generated by the backlight is seen as an image by the user, and 2) low dynamic range because the LC material cannot completely block light to produce a black pixel. The weaknesses of OLED displays are poor reliability and low efficiency (~5% quantum efficiency (QE)) of the blue OLED material. The use of inorganic micro-LEDs (uLEDs) in a display would provide a very high efficiency because the display would not use color filters and polarizers to absorb light. As used herein, a uLED is an LED with a diameter or cross-sectional area of 100 microns or less. The inorganic uLED display would have very high contrast because black pixels are set to emit no light. For an inorganic uLED display, blue gallium nitride (GaN) LEDs would be 35-40% efficient, with a reliability of over 50,000 hours, as has been established in general lighting. Sony has developed a passive matrix of uLEDs arranged in a display array using a pick and place system. However, since large displays require millions of LEDs, displays made by this process are time and cost prohibitive compared to other technologies. The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size LED micro structures, such as rods, fins or disks, can be first fabricated on small size wafers and then be transferred to large panel glass substrate to make a direct emitting display requiring no backlighting.

As in any emissive display fabrication process, opportunities arise where the LEDs becomes mis-located or damaged. Considering the fact that a large area display may be comprised of millions of LEDs, the detection and replacement of defective LEDs can be an extensive chore. For the stamp-transfer assembly of arrayed microcomponents, one process (U.S. Pat. No. 7,723,764) electrically tests fully integrated arrays to identify defective components followed by excising the defective component's driving lines and rerouting them to a replacement component that is mounted atop the defective one.

More generally, substrate-wide processing steps are often used to mitigate the negative effects of missing, mis-located, or broken components by insulating electrical contacts, covering the defect, and excising electrical contacts. U.S. Pat. No. 9,252,375 describes the inspection and selective passivation of missing or defective arrayed components, as well as excision of driver circuit leads to such defects. Most often, emphasis is placed on the production of defect-free arrays. For arrays on the scale of millions of components, however, even very low defect rates can result in an unusable product.

Likewise, defects can occur when using fluidic assembly processes to fabricate large area displays. Therefore, it would be desirable to develop the capability of repairing the low-rate of defects that result from fluidic self-assembly. More explicitly, it would be advantageous if a systematic approach existed for identifying the locations of empty wells or broken emissive elements and subsequent correction, followed by selective removal of all residual unaligned components within the device area.

SUMMARY OF THE INVENTION

Disclosed herein is a process by which a relatively low number of defects resulting from fluidic self-assembly of an emissive display can be systematically identified and repaired. The inspection of each alignment site is necessary for verifying the occupancy of an intact and correctly oriented component. While inspection can be done with microscopy and digital image processing approaches, which are standard in industrial electronics fabrication, in one aspect emissions are induced in assembled arrays to additionally identify correctly located and aligned components that appear whole but are non-functional. Incorrectly located and misoriented devices are also considered non-functional.

The output of the initial inspection test determines if a site is occupied by a functional component, occupied by a nonfunctional or fractured component, or is unoccupied. With the repair operations, the first step is removal of the nonfunctional or fractured components from alignment sites. The second step in repair is to fill the unoccupied sites with functional components. The source of these components may be the unaligned components from the field or a reservoir of fresh emissive elements sufficiently spaced for individual pickup. Both removal and replacement steps may be accomplished by single-component pick-and-remove subsystem. Alternatively, replacement may be achieved by one or more repeated fluidic assembly steps.

The third step in repair is the removal of residual uncaptured components. In fluidic assembly, deterministic control over individual component trajectories is not always possible, and after assembly, components may reside between alignment sites on the receiving substrate surface. For low fill-factor arrays, capture sites represent a small percentage of the total array area and identifying the location of individual mis-located components is both expensive and unnecessary. Rather, the residual mis-located components are removed in a single large-scale step that selects for mis-located components over correctly located components. The success of the repair steps is verified with a final inspection prior to further integration of components to the receiving substrate. If this inspection reveals persisting defects in the array, the repair process may be iterated.

Accordingly, a method is provided for repairing an emissive display. The method provides an emissive substrate including an array of positioned emissive elements. Following assembly, the emissive substrate is inspected to determine defective array sites, and defect items are removed from the emissive substrate. In one aspect, the emissive substrate includes an array of wells, with emissive elements located in the wells, but not electrically connected to the emissive substrate.

In another aspect, the emissive elements are light emitting diodes (LEDs). Then, inspecting the emissive substrate includes irradiating the emissive substrate with ultraviolet (UV) illumination, photoexciting the array of LED, and using an optically filtered inspection to distinguish defective array sites from those with functional LEDs. The defect items may be determined to be missing emissive elements, misaligned, mis-located, or non-functional emissive elements, or debris (e.g., broken emissive element parts). Subsequent to determining misaligned, mis-located, non-functional emissive elements, or debris, a robotic pick-and-remove process is used to remove the defect item. The robotic pick-and-remove process may use an electrostatic, mechanical, or adhesive holding mechanism, as explained in more detail below.

The positioning of replacement emissive elements in the defective array sites may be accomplished using a fluidic assembly or a repurposed pick-and-remove process. Subsequent to positioning replacement emissive elements in any empty wells, the emissive substrate is reinspected to determine defective array sites. If reinspection is passed, the emissive substrate is annealed so as to electrically connect the emissive elements to the emissive substrate.

Additional details of the emissive substrate repair process and an emissive substrate repair system are provided below.

DETAILED DESCRIPTION

Figure 1A:
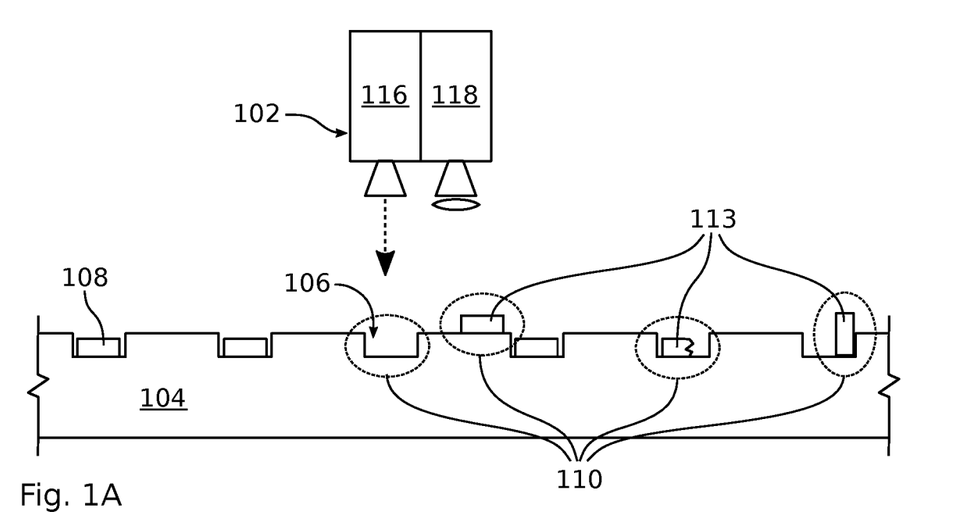
FIGS. 1A through 1C are schematic block diagrams of an emissive display repair system.
Figure 1B:
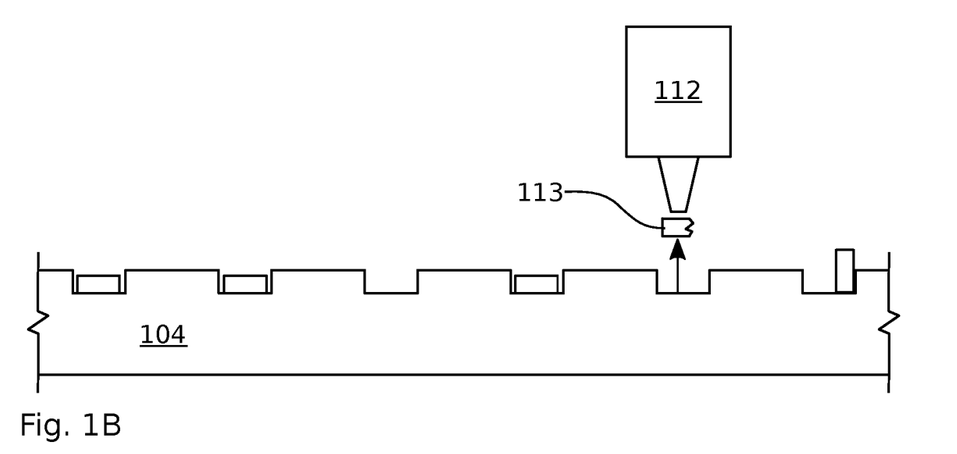
Figure 1C:
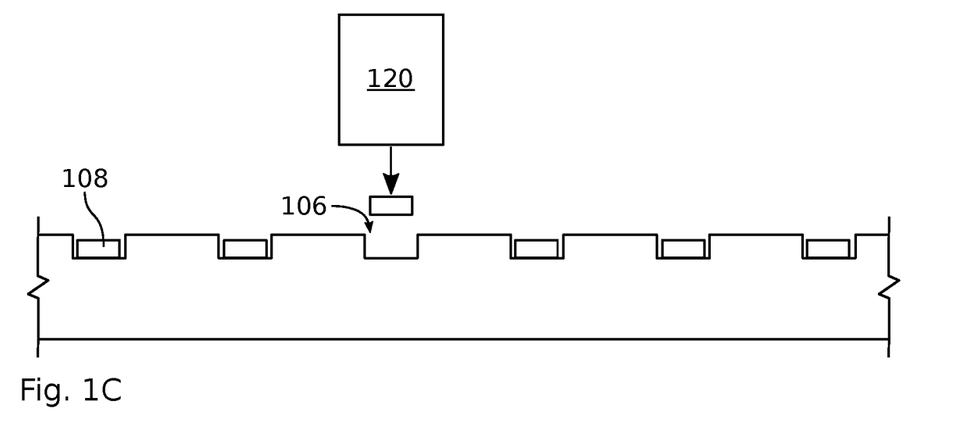

FIGS. 1A through 1C are schematic block diagrams of an emissive display repair system. The system 100 comprises an inspection subsystem 102 for inspecting an emissive substrate 104 with an array of wells 106. As shown, emissive elements 108 are located in the wells 106, but not electrically connected to the emissive substrate 104. Alternatively but not shown, the emissive elements may be located at predetermined array sites on a planar emissive substrate top surface. Typically, the emissive elements 108 are deposited in the wells 106 via a fluidic assembly process, as explained in the parent applications listed in the RELATED APPLICATIONS Section, above. However, the wells may also be populated using a conventional robotic pick-and-place device. The purpose of the inspection subsystem is to determine defective array sites. Defective array sites 110 (circled in phantom) are shown. Advantageously, the defective array sites are determined without the need for electrical (i.e., soldered) connections to the substrate, so that defective emissive elements 108 can be more easily replaced. System 100 also comprises a pick-and-remove subsystem 112 for removing defect items 113 from the emissive substrate 104.

In one aspect, the emissive elements 108 are light emitting diodes (LEDs). In this case, the inspection subsystem 102 comprises an illuminator 116 for irradiating the emissive substrate 104 (or individual LEDs 108) with ultraviolet (UV) spectrum light and photoexciting the LEDs. A dual-mode image sensor 118 identifies the presence of LEDs 108 through visual contrast and edge detection in one mode, while in another mode uses wavelength specific filtration to identify functional LEDs 108 by detecting the desired photoluminescence caused by photogenerated carriers.

For example, a UV laser, a UV LED, a xenon arc lamp, a mercury arc lamp, or a xenon mercury arc lamp may be used as the UV emission unit 110. If the LEDs 108 have leakage current, light emission caused by the photoluminescence effect in the semiconductor layers occurs dominantly, as the recombination of excited electrons is non-emissive. If the LEDs 108 are not defective, the photoluminescence effect occurs in both the active layer and the semiconductor layers. In this case, light emission due to the photoluminescence effect in the active layer becomes dominant, and thus the light being generated has a different color than the defective LED. Hence, light having a predetermined wavelength is generated and thus allows the determination of whether an LED 108 is defective.

The image sensor 118 captures the wavelengths of light generated by defective, non-defective, and missing LEDs 108, and compares the measurements to a predetermined standard. In other aspects, inspection imaging can use spectroscopy instead of wavelength selective filters to more precisely quantify the photoluminescence of UV-excited LEDs. The inspection of LEDs can include a non-binary brightness assessment with a uniformity criterion to determine removal thresholds, and the inspection of LEDs can investigate red-blue-green (RGB) color balance per pixel for later correction.

A spectroscope gathers all the emitted light and records the distribution. This measurement generally does not include position data, as would be the case with a charge-coupled device (CCD) or CMOS sensor, so the position data must come from recording the xy (horizontal) position of the inspection head. This means that only one LED can be inspected at a time. In contrast, a bandgap filtered camera can inspect a larger field of view (but with less quantitation of wavelength).

In the case of gallium nitride (GaN) LEDs, the predominant wavelength is in the blue or green color spectrum, depending the LED doping. In the case of AlGaInP LEDs, the predominant wavelength is in the red color spectrum. The filtered image sensor compares detected photoluminescence to a predetermined map cross-referencing position on the substrate to expected wavelengths. Wavelengths of light either missing or not matching the map of expected colors determine an array site to be defective. The inspection is done prior to the application of any color filter or color modification layers. Thus, depending the display design, the emissive substrate 102 may be fabricated with one type (one color) of LED, two types (two colors) of LEDs, or three types (three colors) of LEDs. In one aspect, the image sensor may be replaced with a spectroscope enabling quantitative wavelength measurements through a necessarily smaller field of view. In another aspect, the filtered image sensor 118 compares measured desired wavelength light intensity to a predetermined standard to determine if an LED is defective. In summary then, the inspection subsystem 102 determines defect items such as missing emissive elements (wells not populated by an emissive element), misaligned emissive elements (wells populated with an "upside-down" emissive element), mis-located (LEDs not located in a well), non-functional emissive elements, and debris (e.g., broken emissive elements, debris resulting from the fabrication of the emissive substrate, or solid objects in the fluidic assembly fluid). In the case of misaligned, mis-located, or nonfunctional emissive elements or debris, the pick-and-remove subsystem 112 uses a robotic pick-and-remove device to remove these defect items 113, as explained in more detail below, the robotic pick-and-place devices uses one of the following holding mechanisms: electrostatic, mechanical, and adhesive. As would be understood in the art, the pick-and-remove device includes a conventional optics/camera subsystem and/or a system for precisely measuring a destination (defect item) with respect to a known reference such as a substrate edge or corner.

Figure 2A:
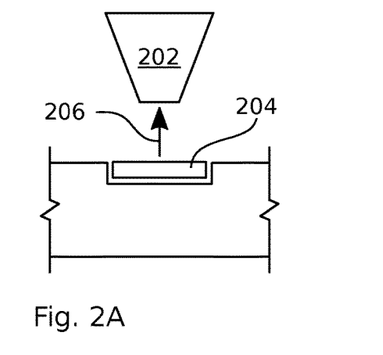
FIGS. 2A and 2B are diagrams depicting an electrostatic pick-and-remove device.
Figure 2B:
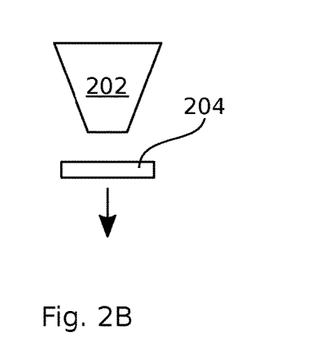

FIGS. 2A and 2B are diagrams depicting an electrostatic pick-and-remove device. Microcomponent emissive elements are held to a transfer head by creating an electrostatic charge on the transfer head that induces charge separation and attraction in the microcomponent. Release is achieved by removing the charge separation in the head. The electrostatic pick-and-remove device 200 comprises a transfer head 202 capable of creating an electrostatic charge to attract a defect item 204 to the transfer head (FIG. 2A). Reference designator 206 represents an attraction force due to the electrostatic charge. The electrostatic charge on the transfer head 202 can be dissipated to release the defect item 204 (FIG. 2B). In one aspect, the transfer head is basically a capacitor concentrating charge on pick-up surface (protected by thin dielectric). A positive charge, for example, on transfer head attracts electrons to the LED top surface, creating a small attractive force. This process is effective because the emissive element has very little mass.

FIGS. 3A through 3F depict an exemplary mechanical pick-and-remove device. The transfer pickup head may be a thin, heatable metal tip connected to a stepper-controlled xyz (capable of movement in three dimensions) transfer head stage. The tip is coated with phase-change material and approaches the substrate surface at the location of the defect item to be removed, followed by resistive heating of the tip inducing melting of the coating material such that it contacts any components, fragments, or debris in the well or substrate top surface. The coating material then solidifies on cooling, removing any loose material from the site when the tip is removed. The material and coating are removed in a bath or spray of solvent to dissolve the coating material and the tip is then recoated with fresh material by dipping in a liquid bath of the phase-change polymer. Alternatively, the transfer head 302 is disposable and thrown out with the attached defect item 310 after use. A strong advantage of this approach is that the z-height (vertical) control near the defective array site may be relatively low precision as the phase change material will droop under gravity to make contact, and removes a wider variety of particle sizes and shapes than electrostatic or elastomeric adhesion. The mechanical force is also capable of exceeding electrostatic or the elastomeric adhesive force.

Figure 3A:
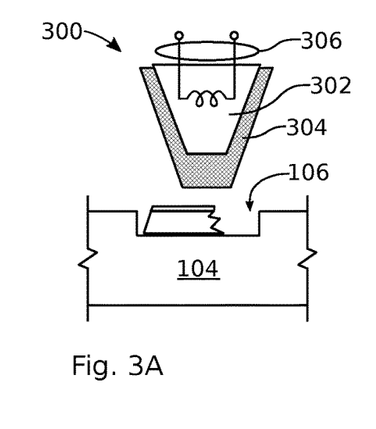
FIGS. 3A through 3F depict an exemplary mechanical pick-and-remove device.
Figure 3B:
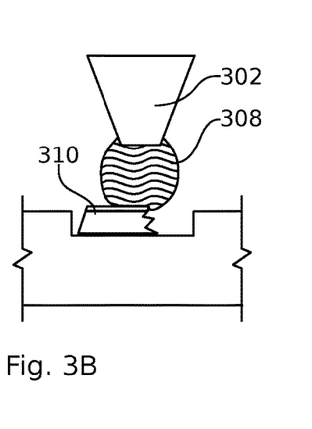
Figure 3C:
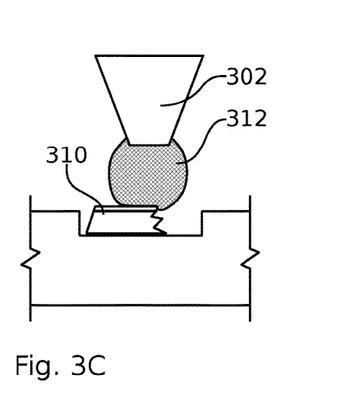
Figure 3D:
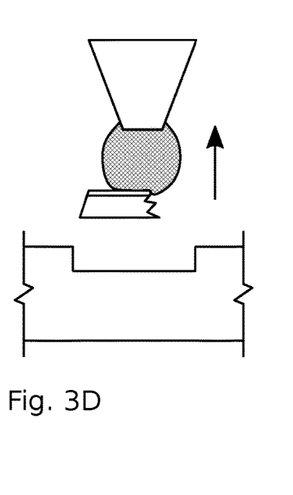
Figure 3E:
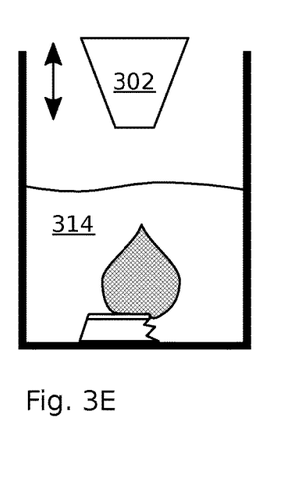
Figure 3F:
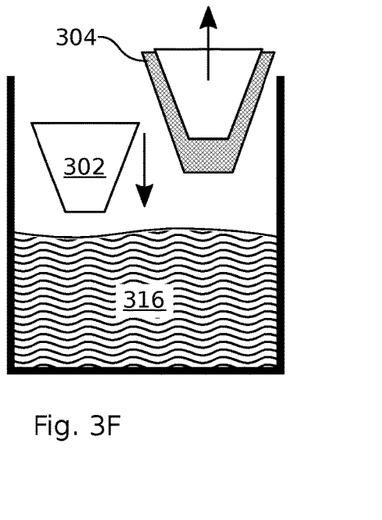

Thus, the mechanical pick-and-remove device 300 comprises a thermal transfer head 302 with a liquid phase polymer coating 304 overlying the thermal transfer head. The thermal transfer head 302 may be heated, as represented by voltage potential 306 (FIG. 3A), to convert a solid phase polymer to a liquid phase 308 or to maintain a polymer in its liquid phase. Subsequent to contacting a defect item 310 (FIG. 3B), the defect item becomes attached to the transfer head. As shown in FIGS. 3C and 3D, the transfer head 303 is cooled to convert the liquid phase polymer to a solid phase 312 attached to the defect item 310. In FIG. 3E the transfer head 302 is cleaned of the polymer with liquid 314 to remove the defect item, and in FIG. 3F the transfer head 302 is recoated with a polymer 304 from a liquid phase polymer bath 316.

Figure 4A:
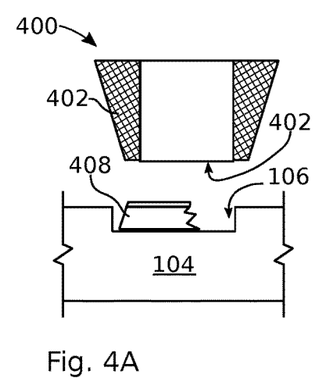
FIGS. 4A through 4C depict an adhesive pick-and-remove device.
Figure 4B:
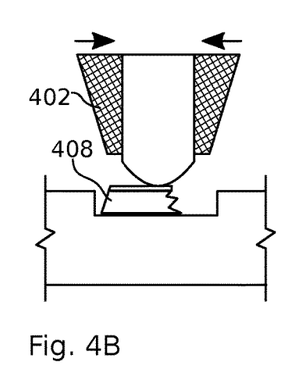
Figure 4C:
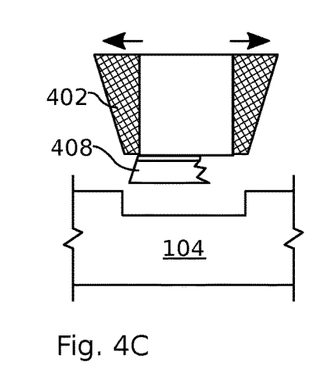

FIGS. 4A through 4C depict an adhesive pick-and-remove device. In one aspect, the defect item and the transfer head are natively adherent, with an overall binding strength scaling with interfacial area. Release is achieved by deflecting of the elastomeric surface which reduces contact area with the rigid defect item microcomponent, reducing the holding force between the transfer head and defect item. The adhesive pick-and-remove device 400 comprises a transfer head 402 with a deformable contact surface area 404. The contact surface area 404 is adhesive, either natively so, or coated with an adhesive layer (FIG. 4A). Since the transfer head 402 does not directly contact the surface of the emissive substrate 104, the transfer head becomes adhesively attached a defect item 408 in response to expanding (deforming) the contact surface area size, as shown in FIG. 4B. The defect item is released in response to bathing the transfer head in a solvent or increasing the deformation of transfer head to reduce the amount of surface area contacting the defect item (not shown).

One variation of the adhesive approach is to coat the transfer head with a liquid, concomitant with the use of a substrate that does not retain any liquid after contact. One example is a hydrophobic substrate surface and a polar liquid that holds the to-be-removed defect item through surface tension after contact.

Returning to FIG. 1C, the repair system 100 may further comprise a replacement subsystem. Empty wells 106 in the emissive substrate can be populated using a fluidic assembly process, or as shown, a repurposed pick-and-remove subsystem 120.

FIGS. 4A through 4C may also be interpreted as steps in the removal of a defective emissive element from a substrate well using a deformable elastomeric transfer head. The repair of fluidically assembled arrays can be broadly reduced to two fundamental operations: the removal of emissive elements from the substrate, and the addition of replacement emissive elements into the emissive substrate wells. Removal of broken or nonfunctional components 408 from the wells 106 requires the pick-and-remove transfer head 402 to overlap the alignment site (e.g., well) before intimate approach and pickup. For removal, the relative position of the transfer head 402 and emissive element component 408 is not critical and can generally be achieved without additional positional feedback in the form of cameras or linear encoders. After pickup, the part is translated away from the assembly area and discarded while the head is reset to pick up and remove the next component. For emissive elements recessed in wells, an adherent elastomeric pick-up head may be deformed to contact the component. For electrostatic heads, an increased field may be necessary to overcome increased distance and the squared law drop off in grip strength. Phase-change material-coated pickup heads are also efficacious at removal of broken components and debris from wells.

After defective and broken components are removed from wells, their previous locations and the initially empty sites are targeted for assembly of new replacement components. This may be done in a similar method to the initial assembly—via fluidic self-assembly, and the inspection/removal steps are repeated until the array achieves desired functional yield. Alternatively, the pick-and-remove xyz transfer head that was used for removal may be repurposed and used to place new components. The addition process requires significantly higher precision in placement than removal, so after new components are picked up from a staging area, the transfer head passes over an up-looking camera that corrects the relative position between the component center and the head center. For radially asymmetric components, angular orientation may also be corrected at this point. The part is then placed into the substrate wells and translated to deposit the component in the recess. For electrostatic adhesion, component deposition may be achieved by de-energizing the electric field, but native stiction for microscale components may necessitate mechanically-assisted detachment.

Figure 5A:
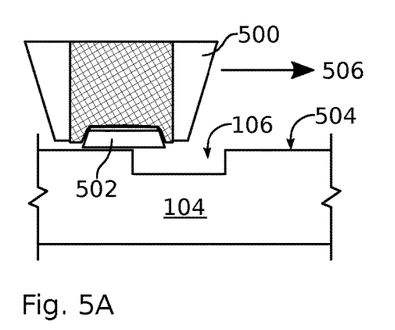
FIGS. 5A through 5C depict an exemplary emissive element replacement process.
Figure 5B:
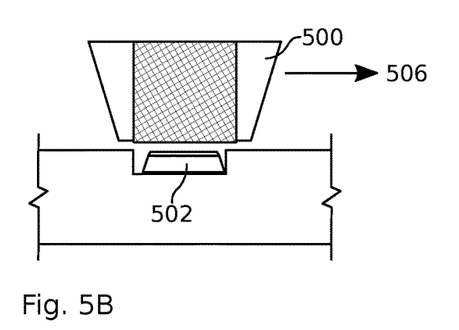
Figure 5C:
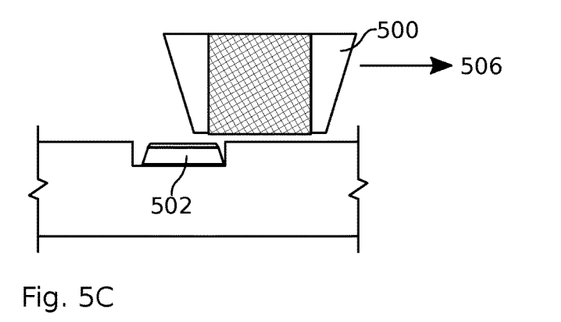

If the reliability of the pick-and-remove translation is insufficient for the scale of the array and the components, a compliant head capable of deflecting, without damage to carried components, is located near the alignment site and lightly presses the component against the assembly surface. The head then translates the contacted component in the region of the recess such that the component is forced into the recess and mechanically retained as shown in FIGS. 5A through 5C. Due to the scale and brittle nature of the components, the down-force is carefully controlled and monitored such as with a piezoelectric force gauge in the pick-and-remove head. In this manner, without perfect knowledge and control over the relative positioning of the picked up component and the well, assembly can still be achieved.

The final repair step is a large-area clean that uses differential forcing to remove any out-of-place (mis-located) components from the substrate. In this case the wells comprise the alignment sites and in-field emissive element components are located on the substrate surface and not laterally confined by the wells. As such, an adherent surface brought into close contact with the substrate surface exerts a significantly stronger force on an out-of-place components than the recessed correctly located components. This attractive force may be provided by coulombic, dielectrophoretic, or chemical adhesion. An additional approach leverages the lateral retention of the wells on correctly located components and provides a mechanical shear force on the substrate surface to dislodge mis-located components. The shear force may be provided by fluid flowing across the substrate or direct forcing provided by a brush or solid surface. A tilted substrate and gravitational forcing may also be used to direct unretained components out of the assembly area into a collection trough. In this case, the substrate may be coupled to a directionally vibrating oscillator to reduce component stiction and the substrate may be covered in a carrier fluid to assist the transit of misaligned components.

The form of non-fluidic and non-gravitational final clean-off may be a cylinder that transits over the surface to remove mis-located components, a rigid sheet of dimensions comparable to the assembly substrate dimensions, a pliant sheet or brush of critical dimensions greater than the component's so as not to dislodge correctly located components while exerting shear force on the substrate surface, or a pliant natively adherent sheet such as, for example, polydimethylsiloxane (PDMS), which pulls mis-located components from the substrate when the sheet is peeled off.

In addition to assembly based on component retention in recessed wells, these approaches are also applicable to any alternate assembly schemes where correctly located components are held more tightly than out-of-place components, and by using a driving force with magnitude between the two adhesion forces. Out-of-place components may then be recycled into ink for future fluidic assembly.

After repair, the substrate is again inspected and verified that all alignment sites are occupied by intact and functional components and no residual out-of-place components remain on the substrate.

FIGS. 5A through 5C depict an exemplary emissive element replacement process. Using any of the above-described robotic pick-and-remove devices as repurposed to deposit emissive elements, a transfer head 500 is shown with an attached replacement emissive element 502. The transfer head 500 positions the replacement emissive element 502 on the emissive substrate 104 top surface 504 at a location proximate to a well 106 to be populated (FIG. 5A). The transfer head 500 translates the replacement emissive element 502 across top surface 504, as represented by arrow 506, over a well 106 opening, forcing the replacement emissive element into the well (FIGS. 5B and 5C).

Figure 6:
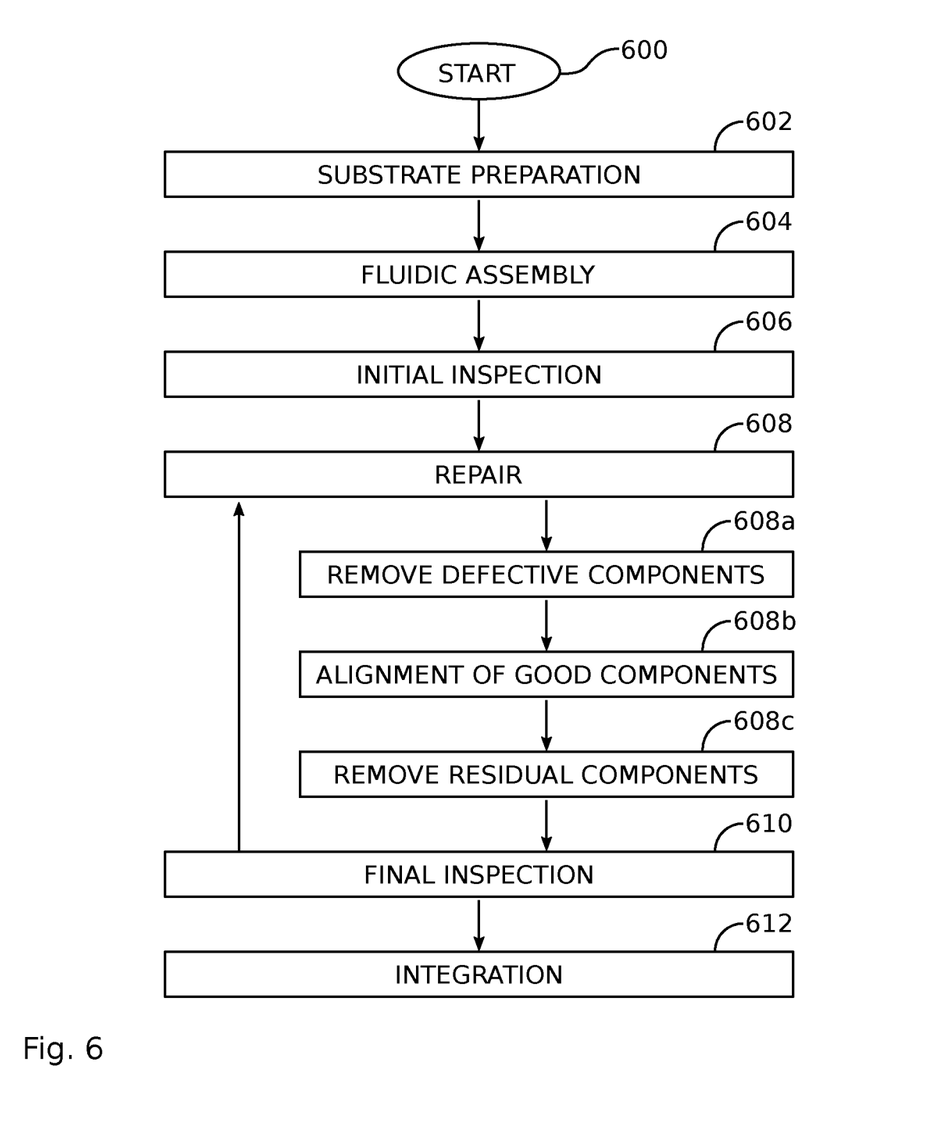
FIG. 6 is a high-level repair process flowchart.

FIG. 6 is a high-level repair process flowchart. The system disclosed herein is a well suited for processes in which a relatively low number of defects resulting from fluidic self-assembly can be systematically identified and repaired. In Step 602 the emissive substrate is prepared, including a matrix of column and row lines needed to selectively enable individual emissive elements, and optionally including active matrix drive circuitry, as described in the parent applications listed in the RELATED APPLICATIONS Section, above. Step 602 also includes the formation of wells in the emissive substrate top surface. In Step 604 a fluidic assembly process positions emissive elements in the emissive substrate wells. In Step 606 an initial inspection is preformed, using the inspection subsystem described in FIG. 1. Inspection of each emissive element site is necessary for verifying the occupancy of an intact and correctly oriented component. While inspection can be done with microscopy and digital image processing approaches which are standard in industrial electronics fabrication, emission can also be induced using UV radiation to additionally identify correctly located and aligned components that appear whole but are non-functional. Correctly located but misaligned devices are also considered non-functional.

In Step 608 defective array sites are repaired. The output of the initial inspection test (Step 606) is a trinary array corresponding to known alignment sites and indicating if the site is: occupied by a functional component, occupied by a nonfunctional component, debris, or unoccupied. Step 608a removes nonfunctional components or debris from alignment sites. The successful execution of this step effectively creates an array with wells in a binary condition, describing sites that are either occupied by a functional component or empty.

Step 608b fills the unoccupied sites with functional components. The source of these components may be the mis-located components from the field (substrate surface) or a reservoir of fresh emissive elements sufficiently spaced for individual pickup by a pick-and-remove device. Thus, both Steps 608a and 608b may be accomplished by single-component pick-and-remove operations. Alternatively, the unoccupied wells may be filled using a second fluidic assembly process.

In Step 608c residual mis-located emissive elements are removed. A mis-located emissive element occupies a place on the emissive substrate outside of a well or assigned position on the substrate surface. In fluidic assembly (Step 602), deterministic control over individual component trajectories is not always possible, and after assembly, mis-located components may reside between wells on the receiving substrate surface. For low fill-factor arrays, alignment sites represent a small percentage of the total array area and identifying the location of individual mis-located components is both expensive and unnecessary. Rather, the residual mis-located components may be removed in a single large-scale step that selects for mis-located components over correctly located components. For example, a brush, wiper, gas, or liquid can be applied to the emissive substrate top surface. Alternatively, if Step 608b used a fluidic assembly process, Steps 608b and 608c may be combined.

The success of these repair steps is verified with a final inspection prior (Step 610), followed by the further integration of components to the receiving substrate in Step 612. If this inspection reveals persisting defects in the array, the repair process is iterated accordingly.

Inspection of the rest of the substrate may be undertaken to assess the extent of residual emissive elements, but the most facile aspect of mis-located component removal is a selective large-scale operation. Otherwise, this process limits initial inspection (Step 606) to well sites and includes an examination of the full-substrate area in the final inspection (Step 610) before integration. Thus, two inspection methods are presented: large-area inspection and site-by-site inspection. If the fluidically assembled components are micro-sized LEDs (uLEDs), having a diameter or cross-section of less than 100 microns, the fundamental mechanism behind both may be photoexcitation of the uLED with UV illumination and wavelength-selective measurement to identify the presence and function of correctly located uLEDs. With sufficiently efficient optics, large-area imaging can characterize uLED disposition over the assembly substrate. If site-by-site inspection or imaging lower than full-area, the imaging system is either arrayed or transited over the assembly substrate surface and the processed image data is used to generate a matrix corresponding to the substrate alignment sites being functional, unoccupied, mis-located, occupied by nonfunctional components, or detecting debris.

Figure 7A:
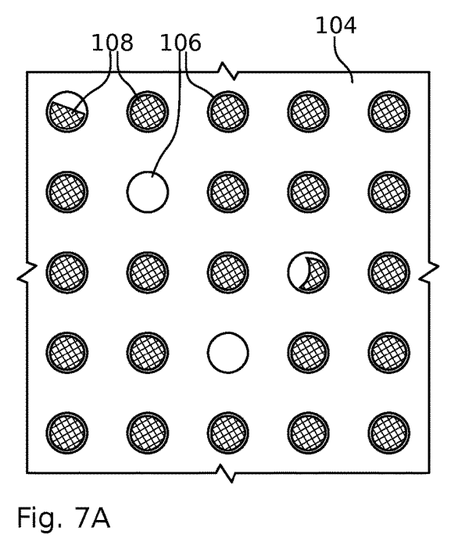
FIGS. 7A through 7D are plan views of an exemplary emissive substrate following a fluidic assembly process.
Figure 7B:
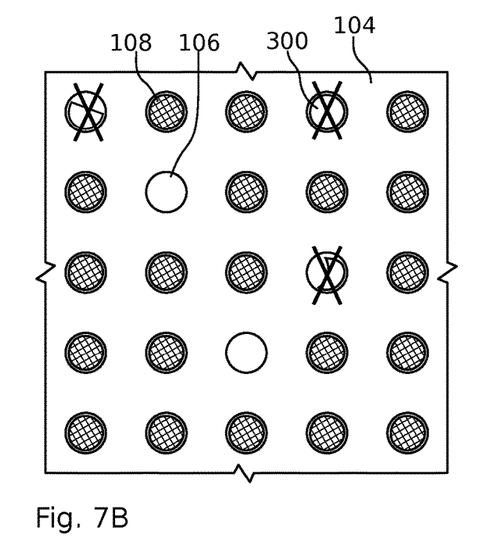
Figure 7C:
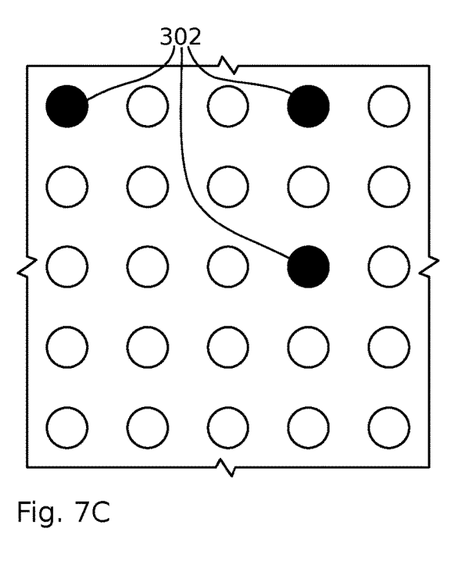
Figure 7D:
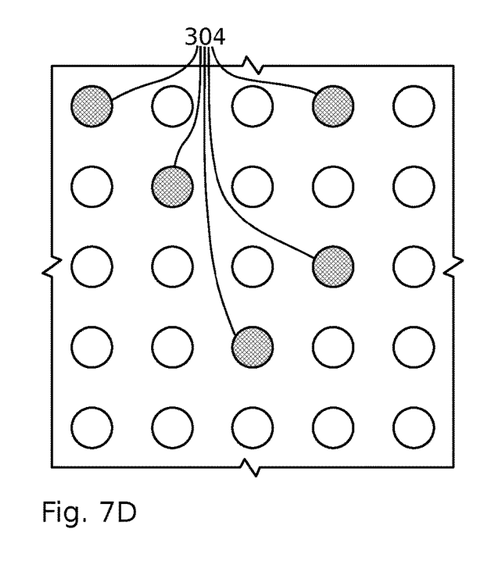

FIGS. 7A through 7D are plan views of an exemplary emissive substrate following a fluidic assembly process. As integration relies on whole components for electrode contacts, broken but functional components are also removed. FIG. 7A depicts the results of a visual inspection. As shown, most of the wells 106 are occupied with an emissive element 108, but some wells are unoccupied. Assuming the emissive elements are LEDs, FIG. 7B depicts the result obtained in response to exposing the emissive substrate to UV radiation. Some sites 300, marked with an "x" are occupied but do not respond with the expected intensity or wavelength, indicating the occupying LED is defective. FIG. 7C depicts wells 302 where defective LEDs are to be removed, and FIG. 7D depicts wells 304 to be repopulated with replacement LEDs.

In one aspect, the repair tool is a 3-axis pick-and-remove head capable of handling microcomponents for repair of fluidic assembly's primary defect modes: missing components, misaligned components, and mis-located components residual on the substrate surface, and broken components occupying alignment sites. Industry standard pick-and-place operations are conventionally performed with a pneumatic pressure-based holding force between head and component, which requires the vacuum port to be smaller than the component handling face. In the case of microcomponents, the vacuum-based approach becomes less appropriate as the micro-scale port diameter restricts gas flow, creating significant pneumatic resistance that slows operation. Additionally, such small ports become susceptible to clogging. At the micro-scale, alternate handling approaches are desirable.

For use with the repair system described herein, the pick-and-remove transfer head contact face may be smaller than the minimum array pitch (between wells) and larger than the emissive element contact face, so that it is capable of transferring single microcomponents. As noted above, the method for holding components to the transfer head may be electrostatic, mechanical, or adhesive. Alternatively, the transfer head may incorporate a mechanical attachment such as microelectromechanical machine system (MEMS) tweezers, topographic retention features, or vacuum pulled through a microporous feature with pores significantly smaller than component dimensions. For components without radial symmetry, a 4-axis pick-and-place transfer head may be used.

Figure 8A:
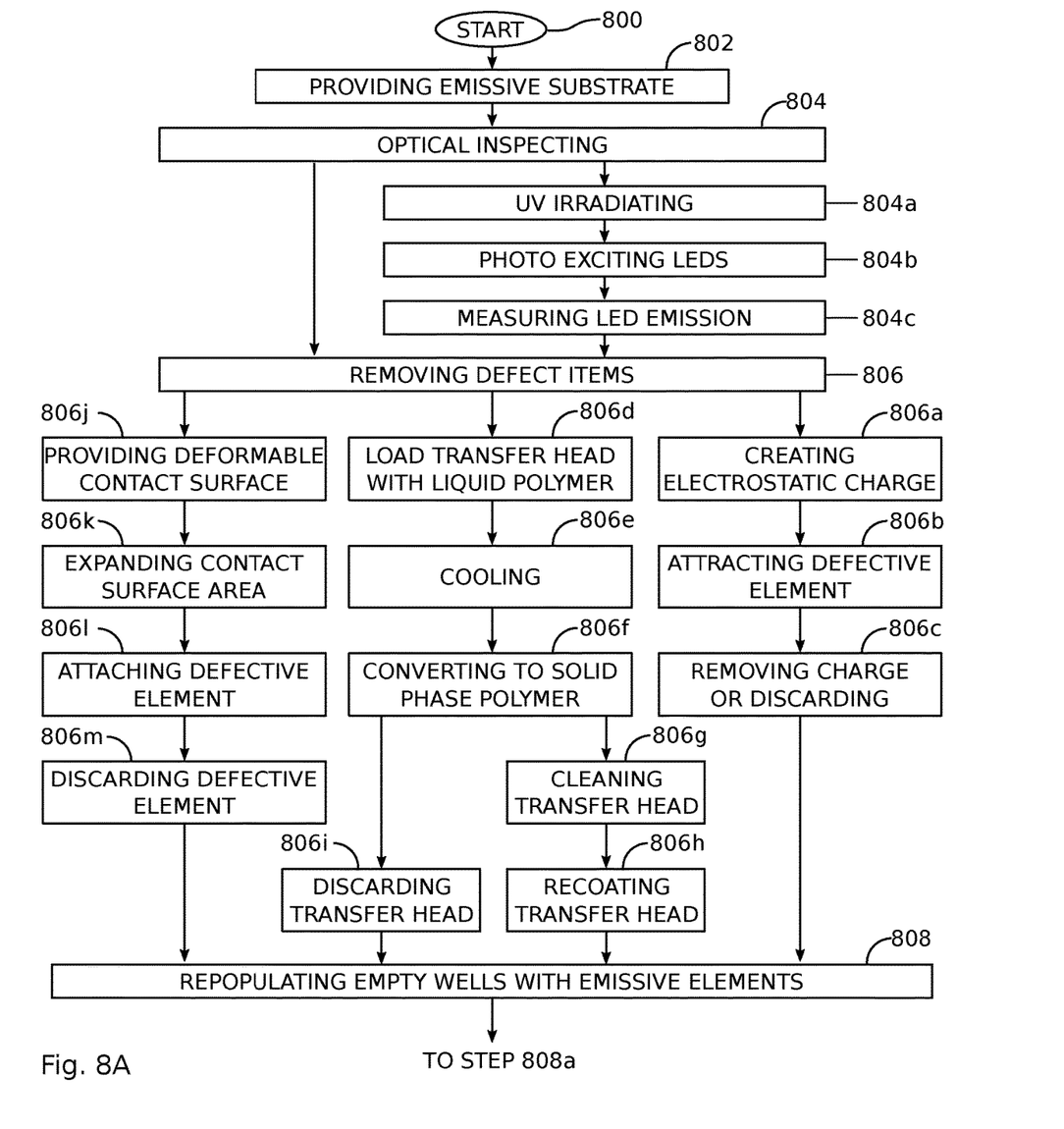
FIGS. 8A and 8B are a flowchart illustrating a method for repairing an emissive substrate.
Figure 8B:
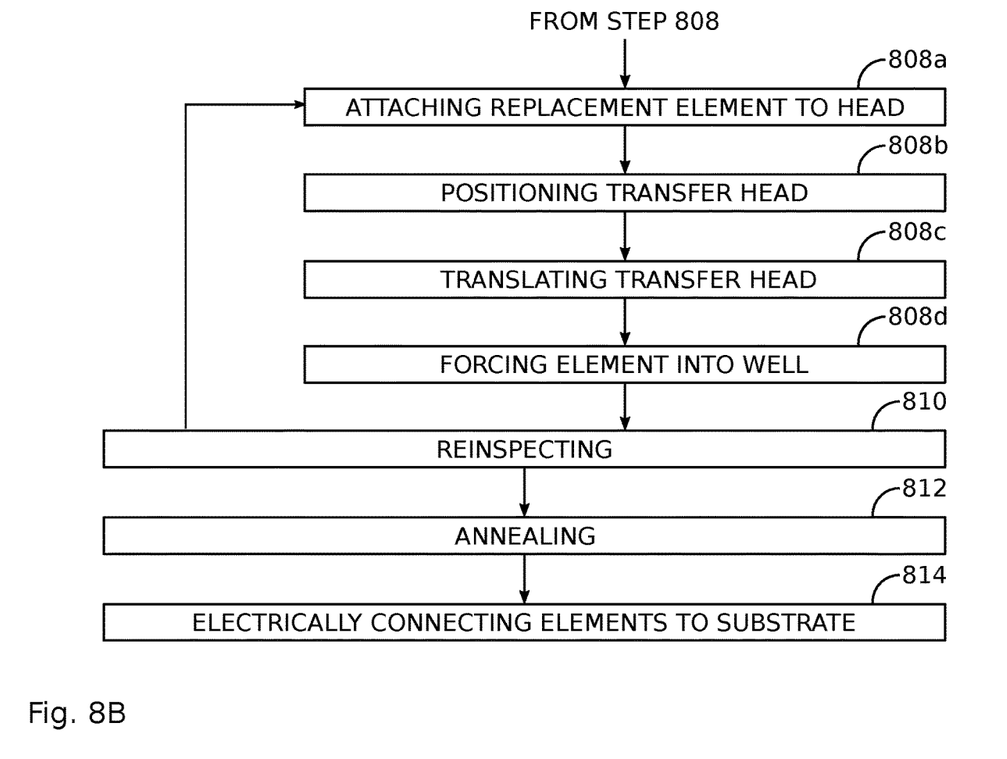

FIGS. 8A and 8B are a flowchart illustrating a method for repairing an emissive substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides an emissive substrate including an array of positioned emissive elements. Step 804 inspects the emissive substrate to determine defective array sites. Step 806 uses a pick-and remove process to remove defect items from the emissive substrate defective array sites. Subsequent to populating empty wells with replacement emissive elements in Step 808, Step 810 reinspects the emissive substrate to determine defective array sites, and subsequent to passing reinspection, Step 812 anneals the emissive substrate. In response to the annealing, Step 814 electrically connects the emissive elements to the emissive substrate.

In one aspect, Step 802 provides an emissive substrate with an array of wells, with emissive elements located in the wells, but not electrically connected to the emissive substrate. If the emissive elements are LEDs, inspecting the emissive substrate in Step 804 includes substeps. Step 804a irradiates the emissive substrate with UV illumination. Step 804b photoexcites the array of LED, and Step 804c measures LED illumination at predetermined wavelengths to determine defective array sites. The defect items may include misaligned emissive elements, mis-located emissive elements, non-functional emissive elements, or debris. Subsequent to determining the above-mentioned defect items, Step 806 uses the robotic pick-and-remove process to remove emissive elements from the defective array sites. The robotic pick-and-remove process used may use one of the following holding mechanisms: electrostatic, mechanical, or adhesive.

In the case of the electrostatic mechanism, Step 806a creates an electrostatic charge between a pick-and-remove transfer head and a defect item. Step 806b attracts the defect item to the transfer head in response to the electrostatic charge, and Step 806c either removes (dissipates) the electrostatic charge to release the defect item from the transfer head, or the step disposes of the transfer head with attached defect item.

In the case of the mechanical mechanism, Step 806d coats a pick-and-remove transfer head with a liquid polymer. Subsequent to contacting a defective emissive element with the transfer head, Step 806e permits the transfer head to cool, Step 806f converts the polymer to a solid phase attached to the defective emissive element. Step 806g cleans the transfer head to remove the defective emissive element, and Step 806h recoats the transfer head with a liquid phase polymer. Alternatively, Step 806i discards the transfer head with the attached defect item.

In the case of the adhesive mechanism, Step 806j provides a pick-and-remove deformable contact surface area transfer head that is adhesive with respect to a defective emissive element. Step 806k expands the transfer head deformable contact surface area to contact a defective emissive element, and in response to the contact, Step 806l attaches the defective emissive element to the transfer head. More explicitly, in Step 606j the deformable contact surface may initially be a first flat surface area, and Step 806k expands the transfer head deformable contact surface area to create a second convex surface area to contact a defective emissive element positioned in a substrate well. Step 806m discards the defect item.

In one aspect where the emissive substrate comprises an array of wells populated with emissive elements, Step 808 populates empty wells with replacement emissive elements using a repurposed robotic pick-and-remove process as follows. Step 808a attaches a replacement emissive element to a pick-and-remove transfer head. Step 808b positions the replacement emissive element on the emissive substrate top surface at a location proximate to a well to be populated. Step 808c translates the replacement emissive element across top surface. In response to translating the replacement emissive element over an opening in the well, Step 808d uses an elastic deformation force to direct the replacement emissive element into the well.

A system and method have been provided for emissive substrate repair. Examples of particular process steps and hardware units have been presented to illustrate the invention. However, the invention is not limited to merely these examples. Other variations and embodiments of the invention will occur to those skilled in the art.

We claim:

1. An emissive display repair system, the system comprising: an inspection subsystem for inspecting an emissive substrate with an array of wells and determining defective array sites, where each well is configured with a solderable electrical interface and populated with emissive elements located in the wells, and where each emissive element is configured with a solderable electrical interface that is not solder connected to the emissive substrate well solderable interface; a pick-and-remove subsystem for removing defect items from the emissive substrate comprising: a transfer head with a deformable contact surface area that adheres to a defect item; and a replacement subsystem for populating empty wells with replacement emissive elements, the replacement subsystem using a process selected from the group consisting of fluidic assembly or a repurposed pick-and-remove device.

2. The system of claim 1 wherein the emissive elements are light emitting diodes (LEDs);
wherein inspection subsystem comprises:
an illuminator for irradiating the emissive substrate with ultraviolet (UV) spectrum light and photoexciting the LEDs; and,
a dual-mode image sensor for measuring visual contrast and edge detection in a first mode, and wavelength-specific filtration in a second mode to identify functional LEDs.

3. The system of claim 1 wherein the inspection subsystem determines defect items selected from a group consisting of missing emissive elements, misaligned emissive elements, mis-located emissive elements, non-functional emissive elements, and debris.

4. The system of claim 3 wherein the inspection subsystem determines a defect item selected from the group consisting of misaligned emissive elements, mis-located emissive elements, non-functional emissive elements, or debris; and,
wherein the pick-and-remove subsystem uses a robotic pick-and-remove device to remove the defect item.

5. The system of claim 1 wherein the transfer head becomes adhesively attached to a defect item in response to expanding the contact area.

6. The system of claim 2 wherein the sensor measures a characteristic selected from the group consisting of photoluminescence intensity and photoluminescence wavelengths.

7. The system of claim 2 wherein the sensor measures red-green-blue (RGB) color mapping.

8. The system of claim 2 wherein the sensor is selected from a group consisting of a spectroscope, charge-coupled device (CCD), and CMOS sensor.

9. The system of claim 1 wherein the transfer head contact surface and defect item are inherently adhesive.

10. The system of claim 1 wherein the transfer head contact surface is coated with an adhesive material.

11. The system of claim 10 wherein the pick-and-remove subsystem further comprises a solvent bath to dissolve the adhesive and remove the defect item from the transfer head contact surface.

12. The system of claim 1 wherein the transfer head contact surface expands to form a convex contact surface with a first radius of curvature adhering to the defect item.

13. The system of claim 1 wherein the transfer head contact surface releases the defect item in response to a translation movement creating friction between the defect item and a release surface.

14. An emissive display repair system, the system comprising: an inspection subsystem for inspecting an emissive substrate with an array of wells and determining defective array sites, where each well is configured with a solderable electrical interface and populated with emissive elements located in the wells, and where each emissive element is configured with a solderable electrical interface that is not solder connected to the emissive substrate well solderable interface; a pick-and-remove subsystem for removing defect items from the emissive substrate comprising: a transfer head with a deformable contact surface area that adheres to a defect item; and a replacement subsystem for populating empty wells with replacement emissive elements comprising: the transfer head with deformable contact surface area that is adhesively attached to a replacement emissive element.

15. The system of claim 14 wherein the transfer head contact surface forms a concave surface with a first radius of curvature that is adhesively attached to the replacement element.

16. The system of claim 15 wherein the transfer head contact surface forms a concave surface with a second radius of curvature, greater than the first radius of curvature, to release the replacement element.

* * * * *